US006281702B1

(12) United States Patent
Hui

(10) Patent No.: US 6,281,702 B1
(45) Date of Patent: Aug. 28, 2001

(54) CMOS SMALL SIGNAL TERMINATED HYSTERESIS RECEIVER

(75) Inventor: David T. Hui, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/580,802

(22) Filed: May 30, 2000

(51) Int. Cl.[7] ............................................. H03K 19/003
(52) U.S. Cl. ................................................. 326/30; 326/26
(58) Field of Search ................................ 326/30, 26, 27, 326/31, 21

(56) References Cited

U.S. PATENT DOCUMENTS

| 4,228,369 | 10/1980 | Anantha et al. |
| 4,525,830 | 7/1985 | Cohen et al. ............................ 370/60 |
| 4,748,426 | 5/1988 | Stewart ............................... 333/22 R |
| 4,989,202 | 1/1991 | Soto et al. ............................ 370/13 |
| 5,204,860 | 4/1993 | Sparks ............................... 370/110.1 |
| 5,387,131 | 2/1995 | Foreman et al. ..................... 439/620 |
| 5,493,657 | 2/1996 | Van Brunt et al. .................. 395/308 |
| 5,523,704 | 6/1996 | Lingkon So ......................... 326/30 |
| 5,675,580 | 10/1997 | Lyon et al. .......................... 370/250 |
| 5,729,824 | 3/1998 | O'Neill et al. ....................... 455/3.1 |
| 5,781,028 * | 7/1998 | Decuir ................................. 326/30 |
| 5,850,387 | 12/1998 | Lyon et al. .......................... 370/250 |
| 5,917,827 | 6/1999 | Cantwell ............................. 370/466 |
| 5,977,797 | 11/1999 | Gasparik ............................. 326/86 |

FOREIGN PATENT DOCUMENTS

404020120A * 1/1992 (JP) .

* cited by examiner

Primary Examiner—Michael Tokar
Assistant Examiner—James H. Cho
(74) Attorney, Agent, or Firm—Lynn L. Augspurger

(57) ABSTRACT

A terminator circuit for connection to a network can be fabricated and used within CMOS-SOI (complementary metal oxide semiconductor—silicon on insulator) for carrying smal logic level signals for connecting data from a network's first circuit to a network's second circuit in which a network's input terminal connects a terminator circuit to the network's second circuit to act as a terminator on the data line passing data from said first circuit to said second circuit. The terminator circuit has a reference circuit coupled to a terminal circuit and to a differential hysteresis receiver. The tuned voltage levels supplied to said terminator input circuit for the termination to the network as a terminator on the data line passing data from said first circuit to said second citcuit supplying, and also, supplied to the hysteresis differential receiver which is integrated into the terminator circuit to set up a threshold tuned reference voltage between the logic levels of said terminator input circuit for the network.

14 Claims, 5 Drawing Sheets

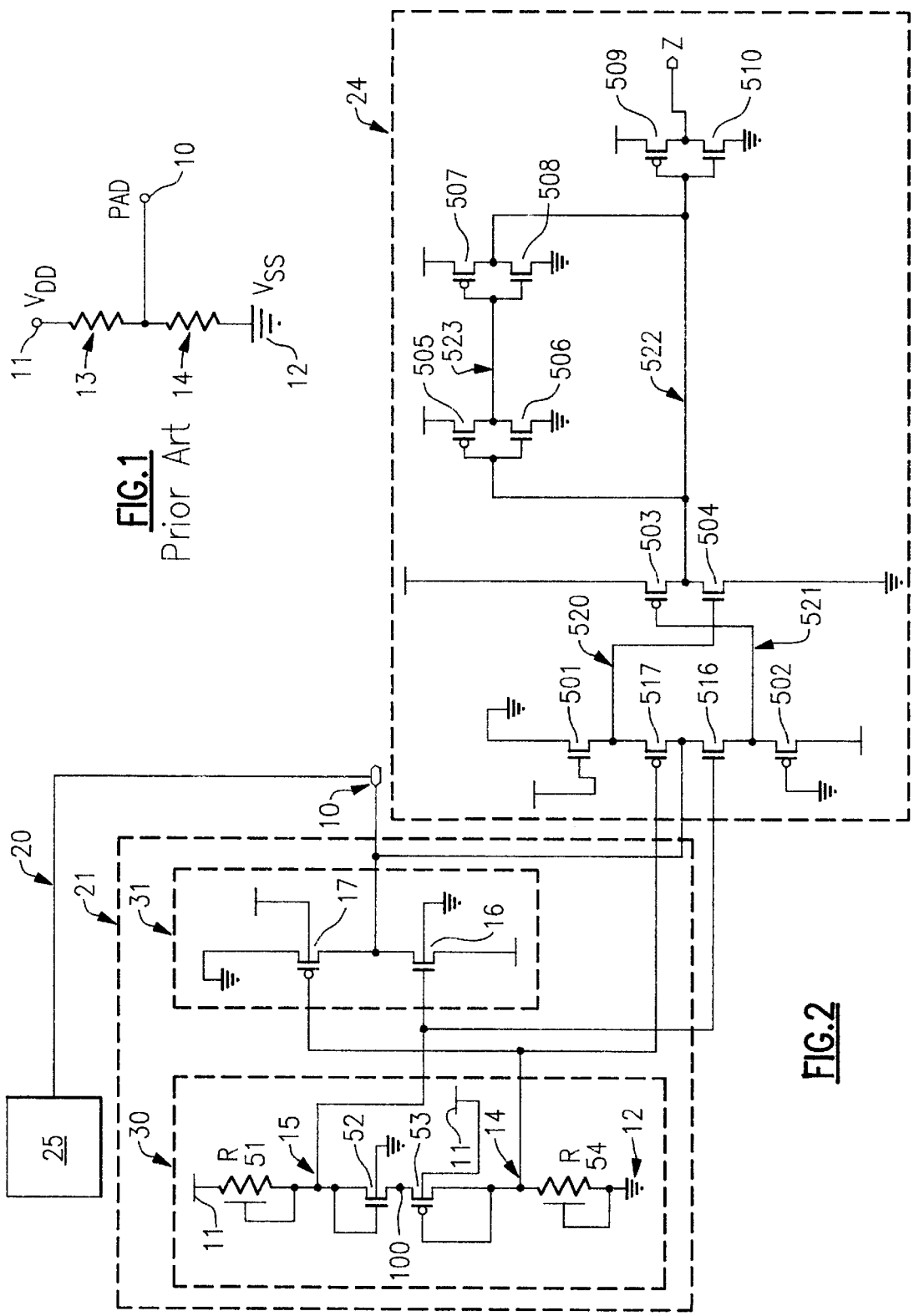

T1.0:IEVDD
T1.0:IEVSS
T1.0:IEIN
T1.0:IEVDD1
T1.0:IEINRT1
T1.0:IEVSS1

CMOS SMALL SIGNAL TERMINATED HYSTERESIS RECEIVER

RELATED APPLICATIONS

This application is related to the following concurrently filed application (s):

U.S. Ser. No. 09/580,290, filed May 30, 2000, entitled: CMOS Small Signal Terminator and Network, naming David T. Hui, inventor; and U.S. Ser. No. 09/583,187, filed May 30, 2000, entitled: SOI SMALL SIGNAL TERMINATOR AND NETWORK, naming David T. Hui, inventor; and U.S. Ser. No. 09/583,185, filed May 30, 2000, entitled: Method for use with a Terminator and Network, naming David T. Hui," inventor; and U.S. Ser. No. 09/580,289, filed May 30, 2000, entitled: CMOS Small Signal Terminated Receiver, naming David T. Hui, inventor; and U.S. Ser. No. 09/583,055, filed May 30, 2000, entitled: CMOS Small Signal Switchable Terminator Network, naming David T. Hui, inventor, and U.S. Ser. No. 09/583,186, filed May 30, 2000, entitled: CMOS Small Signal Switchable Adjustable Impedance Terminator Network, naming David T. Hui, inventor; and U.S. Ser. No. 09/580,789, filed May 30, 2000, entitled: CMOS Small Signal Switchable and Adjustable Terminator Network, naming David T. Hui, inventor; and U.S. Ser. No. 09/583,188, filed May 30, 2000, entitled: CMOS Small Signal Switchable Impedance and Voltage Adjustable Terminator Network, naming David T. Hui, inventor; and U.S. Ser. No. 09/580,805, filed May 30, 2000, entitled: CMOS Small Signal Switchable Impedance and Voltage Adjustable Terminator Network and Receiver Integration, naming David T. Hui, inventor; and U.S. Ser. No. 09/583,680, filed May 30, 2000, entitled: CMOS Small Signal Switchable Impedance and Voltage Adjustable Terminator with Hysteresis Receiver Network, naming David T. Hui, inventor; and U.S. Ser. No. 09/580,942, filed May 30, 2000, entitled: SOI Small Signal Terminated Hysteresis Receiver, naming David T Hui, inventor; and U.S. Ser. No. 09/580,943, filed May 30, 2000, entitled: SOI Small Signal Terminated Receiver, naming David T. Hui, inventor.

FIELD OF THE INVENTION

This invention relates to terminators which are applicable to metal oxide semiconductor (MOS) integrated circuit technology and which are particularly useful for terminator networks.

This related application(s) and the present application are owned by one and the same assignee, International Business Machines Corporation of Armonk, N.Y.

The descriptions set forth in these co-pending applications are hereby incorporated into the present application by this reference.

Trademarks: S/390 and IBM are registered trademarks of International Business Machines Corporation, Armonk, N.Y., U.S.A. Other names may be registered trademarks or product names of International Business Machines Corporation or other companies.

BACKGROUND

For signal interfaces between devices terminators have been used, as described for instance in U.S. Pat. No. 4,748,426: entitled "Active termination circuit for computer interface use", granted May 31, 1988 to Alexander Stewart for Rodime PLC, in an active termination circuit for a computer interface for reducing line reflection of logic signals. Such terminators have used a first and second resistor combination to permanently connect to a signal line that couples a plurality of peripheral devices to one another. The other ends of the first and second resistors are connected through a switching device to a positive voltage supply line and to logic ground, respectively. When termination of multiple devices was required, a plurality of resistor combinations were provided but on/off control of the switch in this example was achieved by one control that is located remote from the termination circuit systems. Integrated circuit interconnection structures have also used precision terminating resistors, as illustrated by U.S. Pat. No. 4,228,369, granted in October, 1980 to Anantha et al. for IBM.

As will be illustrated for chip interconnection, when resistor terminators are used in thin film semiconductor integrated circuits such as those used in metal oxide semiconductors (e.g. CMOS) today, they create hot spots which cannot be adequately cooled, so such resistor terminator circuits which create hot spots cannot be used in metal oxide semiconductor applications to provide terminators for chip to chip connections on chips using IBM's new sub-micron MOS (CMOS) technologies where because of the high currents used in these networks it is difficult or impossible to meet all the cooling and reliability requirements required for commercial performance. It has become necessary to invent a solution to interfacing devices which can be used in such environments on chips, and used for terminators in networks of chips and devices where there is a need to transmit digital data therebetween without overshoot and undershoot in signal transmission between the chips and devices or systems. These connections need to operate at a faster speed, accommodating data rate speeds ranging into hundreds of Mhz and Ghz.

The creation of a terminator which particularly may be fabricated for high speed metal oxide semiconductor on insulator (MOS-soi) applications with triple wells in integrated circuits is needed.

Also, a conventional CMOS receiver does not have good control on its threshold voltage to deal with small signals. It is therefore a need to set up a well balanced threshold voltage between the logic levels, and implement hysteresis in its receiver, so that maximum noise tolerance between logic levels can be achieved for this network and digital system.

SUMMARY OF THE INVENTION

The preferred embodiment of the invention provides a CMOS small signal terminated hysteresis receiver for a terminator network which allows setting up a well balanced threshold voltage between the logic levels of a terminator for a network, and to implement hysteresis in the network receiver, so that maximum noise tolerance between logic levels can be achieved for this network and digital system. The hysteresis receiver can receive small signals properly. The receiver has enlarged noise tolerance between upper and lower logic levels.

The terminator network is adapted for MOS that can match the characteristic impedance of the line.

The present invention also provides a terminator network which is fast and suitable for small signal swings and may also in a mixed technologies communication.

The combined terminator and receiver network has low current flow and low power consumption.

Still another objective of the present invention to provide a terminator network that provides ESD protection at the input of an attached circuit.

Other objects and advantages of the invention will be apparent from the specification.

These and other improvements are set forth in the following detailed description. For a better understanding of the invention with advantages and features, refer to the description and to the drawings.

DESCRIPTION OF THE DRAWINGS

FIG. 1 illustrates the piror art Resistor Terminator Network.

FIG. 2 illustrates the preferred embodiment of a new CMOS small signal terminated hysteresis receiver network.

Figure 3:
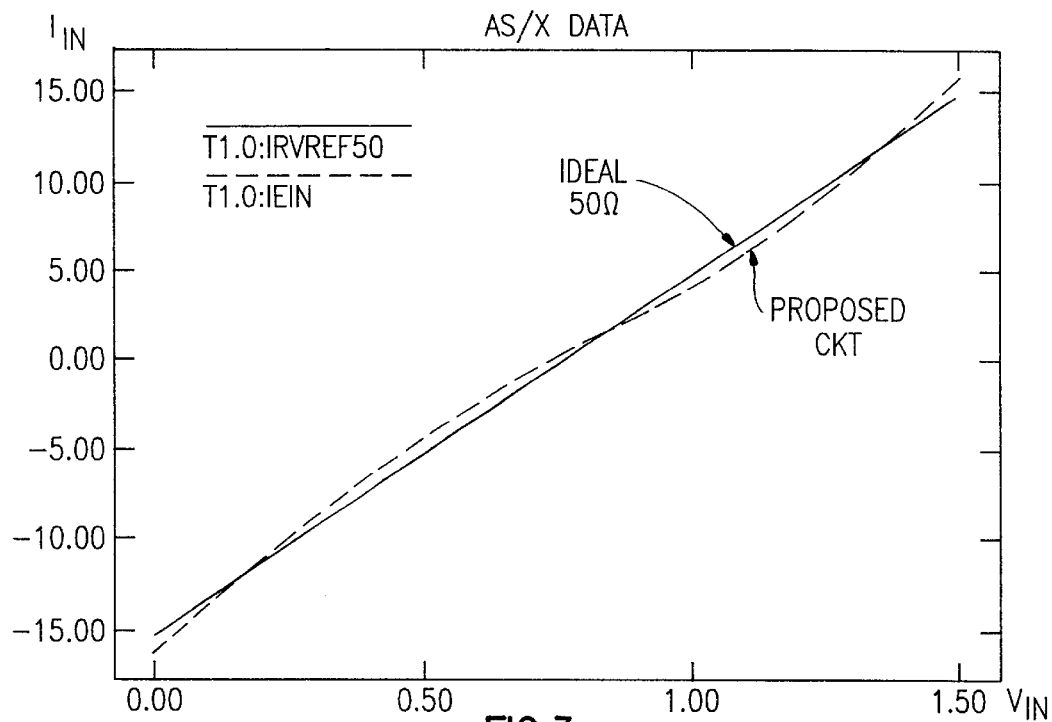
FIG. 3 is a graph having two curves depicting input currents as a function of the input voltages for the CMOS small signal terminator network constructed according to the present invention and a ideal 50 ohm terminator.

Our detailed description explains the preferred embodiments of my invention, together with advantages and features, by way of example with reference to the drawings.

DETAILED DESCRIPTION OF THE INVENTION

As noted, prior art resistor terminators were used in prior art as shown in FIG. 1. Where resistor 13 is connected to node 11 to the upper power supply VDD and the other end of resistor 13 is connected to the node 10 and is also connected in series to resistor 14, The other end of resistor 14 is then connected to node 12 to the lower power supply VSS. The value of the resistors are set so that node 10 has a bias voltage equal to the center of the in coming signal swing and the parallel combination of the resistors matches the characteristic impedance Z0 of the transmission line that it is connected to, so that no reflections will occur and a clean signal can be obtained. However, These resistor terminators cannot now be used in the high speed applications because of the significant power that is dissipated in them. It would also be very difficult to construct these resistor terminators on chips using the new sub-micron MOS technologies because of the high currents in this network to meet all the cooling and reliability requirements.

In describing the preferred embodiment of the present invention, reference will be made herein to FIG. 2 to FIG. 7 of the drawings. FIG. 2 shows a network 20 carrying signals from a first circuit 25 to a second circuit 24. An input terminal 10 connects the terminator circuit 21 to the input circuit 24. The first circuit 25 may be operating at a different voltages then the second circuit 24. Generally, the terminating circuit 21 and the second circuit 24 will be constructed very close together physically in the same electronic system. In this invention, Circuit 21 and circuit 24 are integrated together so that it will be most efficient. The first circuit 25 communicating over net 20 may be remotely located in the same electronic system or even external to the electronic system in which the terminating circuit and the second circuit 24 are located. It is preferred that the electronic systems in which the circuits 21, 25 and 24 are located are digital systems as computer systems, and the network 20 may be connecting different components such as different processor or memory buses or data links or may be connecting different electronic components between two computer systems or other electronic systems which need to communicate data, digitized electrical signals or electrical signals.

In the terminator circuit 21 illustrated in FIG. 2 is comprised of a reference circuit 30 and an input circuit 31. The reference circuit 30 generates two reference voltages on node 14 and node 15. These two voltages can be produce independently on separate paths or a single path with series connected devices as shown in FIG. 2 as a prefer embodiment. This reference path is comprised of a series connected resistor 51 from the upper power supply 11 to node 15, and from node 15 it is connected to the gate and drain of nfet 52 the source of nfet 52 is connected to node 100, node 100 is then connected to the source of pfet 53, the gate of pfet 53 is tie to its drain and both connected to node 14, and from node 14 connected resistor 54 and the other end of resistor 54 is connected to the lower power supply 12 or around in this case.

Note that in the preferred embodiment node 100 is tuned to a voltage level equal to the center of the in coming voltage swing between the logic '1' and '0' voltage levels, from herein this center voltage will be call Vcenter. This Vcenter will set node 15 at a voltage which is a vt above the Vcenter and node 14 at a voltage which is a vt below Vcenter. Node 15 is also connected to the gate of nfet 16. Node 14 is also connected to the gate of pfet 17. The sources of nfet 16 and pfet 17 are tie together to the input terminal 10 or PAD, then it is connected to net 20, where it then connects to the driving circuit 25 as stated in the beginning. The operation of this invention is as follows, When the terminal 10 is driven to rise above the Vcenter, The gate to source voltage in pfet 17 is driven to below vt and more, and it starts to turn-on and conduct current to 12 or ground, whereas gate to source of nfet 16 is below vt and therefore no conduction, no current will flow in nfet 16 to 11 or VDD. On the other hand When terminal 10 fall below Vcenter, The gate to source voltage of nfet 16 is above vt and turn-on to conduct current to 11 or the top power supply VDD. Now the pfet 17 is off since the gate to source voltage is above vt.

The preferred embodiment has a back to back gate to drain connected configuration of nfet 52 and pfet 53 in the reference circuit, and this tracks to its corresponding mirror like nfet 16 and pfet 17, and therefore controls each of their turn on voltages and so no excessive through current in nfet 16 and pfet 17 will occur, and since at its logic states one of the input device will be off, and therefore achieve the claim of low power. Therefore it is best suited for a the small signal input operation.

The hysteris receiver is in circuit 24 which is integrated into the terminator circuit 21. The receiver input device nfet 516 is mirror to nfet 16 with its gate connected to node 15, its source to input terminal 10 and drain to node 521 and to drain of load device pfet 502 and the source of pfet 502 connects to node 11 or VDD, pfet 502 is bias "on" with its gate connected to node 12. The other input device pfet 517 is mirrored to pfet 17, with its gate connected to node 14 and its source to input terminal 10 and its drain connected to node 520 and to the drain of a load device nfet 501, The nfet 501 is biased "on" with its gate connected to node 11, The source of nfet 501 is connected to node 12. Since the load devices nfet 501 and pfet 502 are biased "on" at all times, it could be replaced by resistors. Node 520 is then connected to the gate of nfet 504, The source of nfet 504 is connected to node 12 and its drain connected to node 522. The gate of pfet 503 is connected to node 521, source to node 11 and drain to 522. Node 522 is also connected to a two inverter latch which is made up of pfet 505 and nfet 506 for the first inverter, its output node 523 from the first inverter is connected to the input of the second inverter from pfet 507 and nfet 508, The output of this inverter is feed back to node 522 to made the latch and the hysteris path of the receiver. Node 522 is then connected to the gates of the output inverter pfet 509 and nfet 510. The inverter output then connected to the output terminal Z of the hysteris receiver circuit 24.

When a logical "1" is driven to input terminal 10, mirrored pfet 517 will turn on the same way pfet 17 in terminator circuit 21 turns on. It then pull up node 520 above the turn on voltage of nfet 504, Nfet 504 then turns on and over comes the latch feed back pfet 507 and pull down node 522. This then set the receiver output Z to "1" after the output inverter. The nfet 516 is off and node 521 will stay at vdd and pfet 503 will also be off.

When a logical "0" is driven to input terminal 10, mirrored nfet 516 turns on the same way nfet 16 in the terminator circuit 21 turns on. It then pull down node 521 and turn on pfet 503. The pfet 503 turns on will overcome the hysteris latch nfet 508 and node 522 will be pulled up to a logical "1" level. This then set the receiver output Z to "0" after the output inverter. Pfet 517 will be off and node 520 will sit at the same voltage as node 11 GND, and nfet 504 will also be off.

The terminator voltage levels are well set by the Vcenter in node 100 and mirrored into the receiver input devices by the references node 14 and node 15. It will have less process variations.

The sizes of the devices in these paths will determine the amount of hysteris in this receiver to obtain a good noise tolerance and still have good performance.

The results of the small signal terminated hysteris receiver network as constructed according to the present invention are shown in the following figures. The center of the input voltage swing is at vdd/2 for this illustration. Other input voltage swing can be design as well by changing the resistors.

FIG. 3 is a graph having two curves depicting input currents as a function of the input voltages for the CMOS small signal terminator network constructed according to the present invention and a ideal 50 ohm split resistor terminator. As shown the impedance of the present invention can be match very closely to the ideal resistor terminator.

Figure 4:
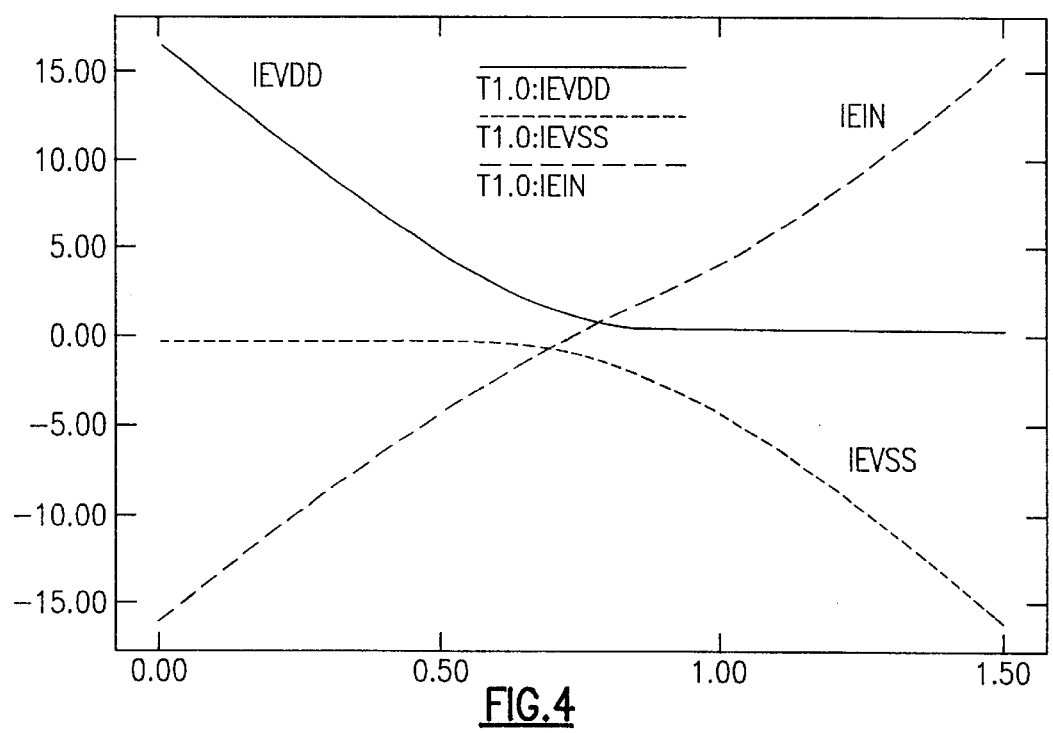
FIG. 4 is a graph having curves depicting the input current as a function of the input voltages for the CMOS small signal terminator constructed according to the present invention and curves of the upper and lower power supply currents as a function of the input voltage.

FIG. 4 is a graph having curves depicting the input current as a function of the input voltages for the CMOS small signal terminator constructed according to the present invention and curves of the upper and lower power supply currents as a function of the input voltage. The input current at the upper half cycle of the input voltage is directed to flow into the lower power supply, and current of the lower half cycle are directed to flow out from the upper power supply. Other then the bias current, there are no through current from the upper to the lower power supplies.

Figure 5:
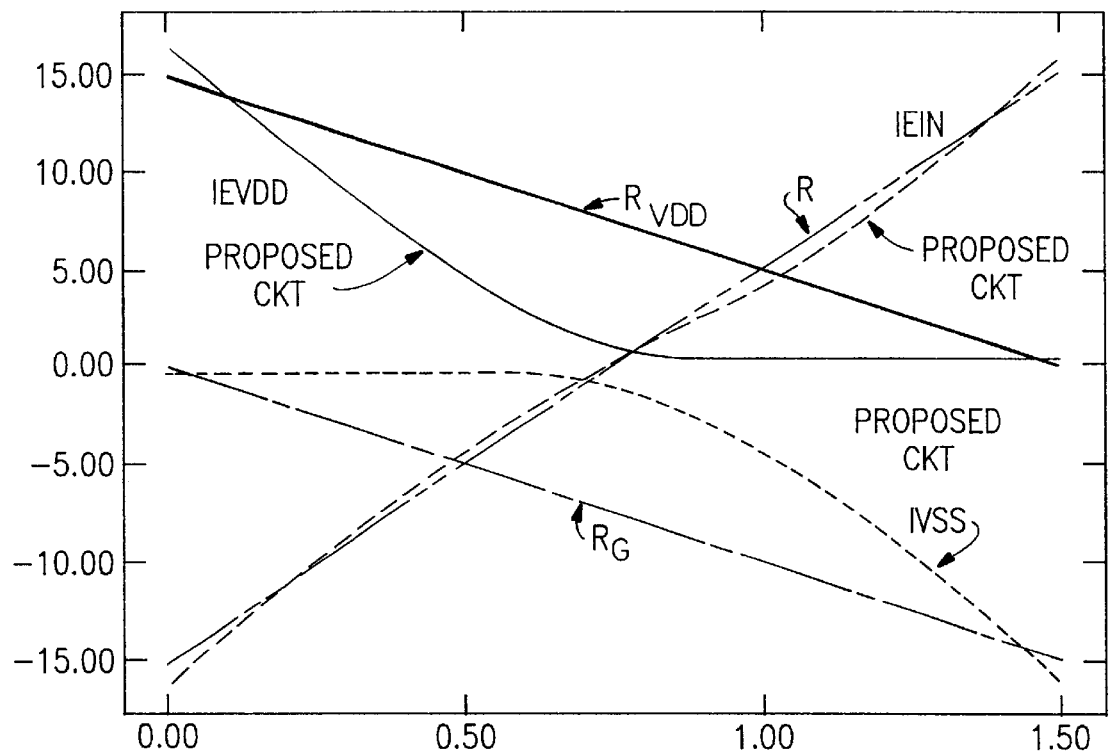
FIG. 5 is a graph having curves depicting the input current as a function of the input voltages for the CMOS small signal terminator constructed according to the present invention and curves of its currents to the upper and lower power supplies as a function of the input voltages. Also having curves of the corresponding input current, and the currents to the upper and lower power supplies for an split resistor terminator as in the piror art.

FIG. 5 is a graph having curves depicting the input current as a function of the input voltages for the CMOS small signal terminator constructed according to the present invention and curves of its currents to the upper and lower power supplies as a function of the input voltages. The FIG. 5 also has curves of the corresponding input current, and the currents to the upper and lower power supplies for an split resistor terminator as in the piror art. This shows the large difference in the power supply currents at and near the center of the swing between the piror art and the present invention.

Figure 6:
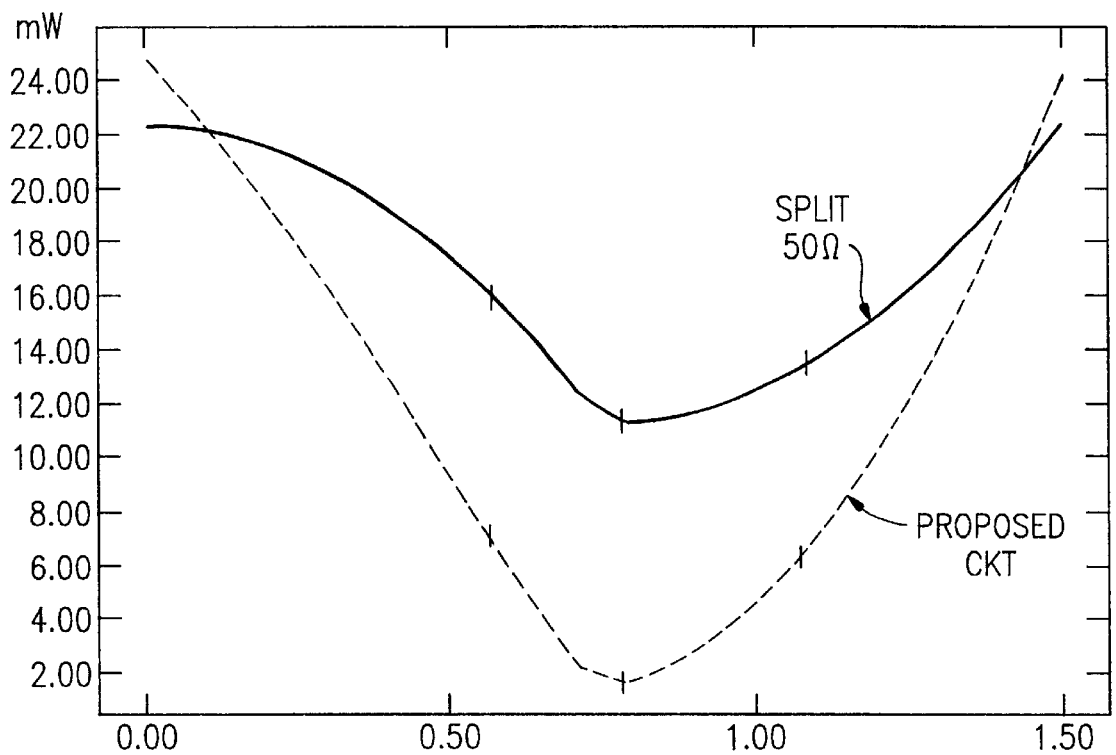
FIG. 6 is a graph having curves of the power consumption as a function of input voltages for the CMOS small signal terminator constructed according to the present invention and the power consumption of a split resistor as in piror art.

FIG. 6 is a graph having curves of the power consumption as a function of input voltages for the CMOS small signal terminator constructed according to the present invention and the power consumption of a split resistor as in piror art. This shows the power which the prior art consumes is a lot more then the present invention in small signal applications.

Figure 7:
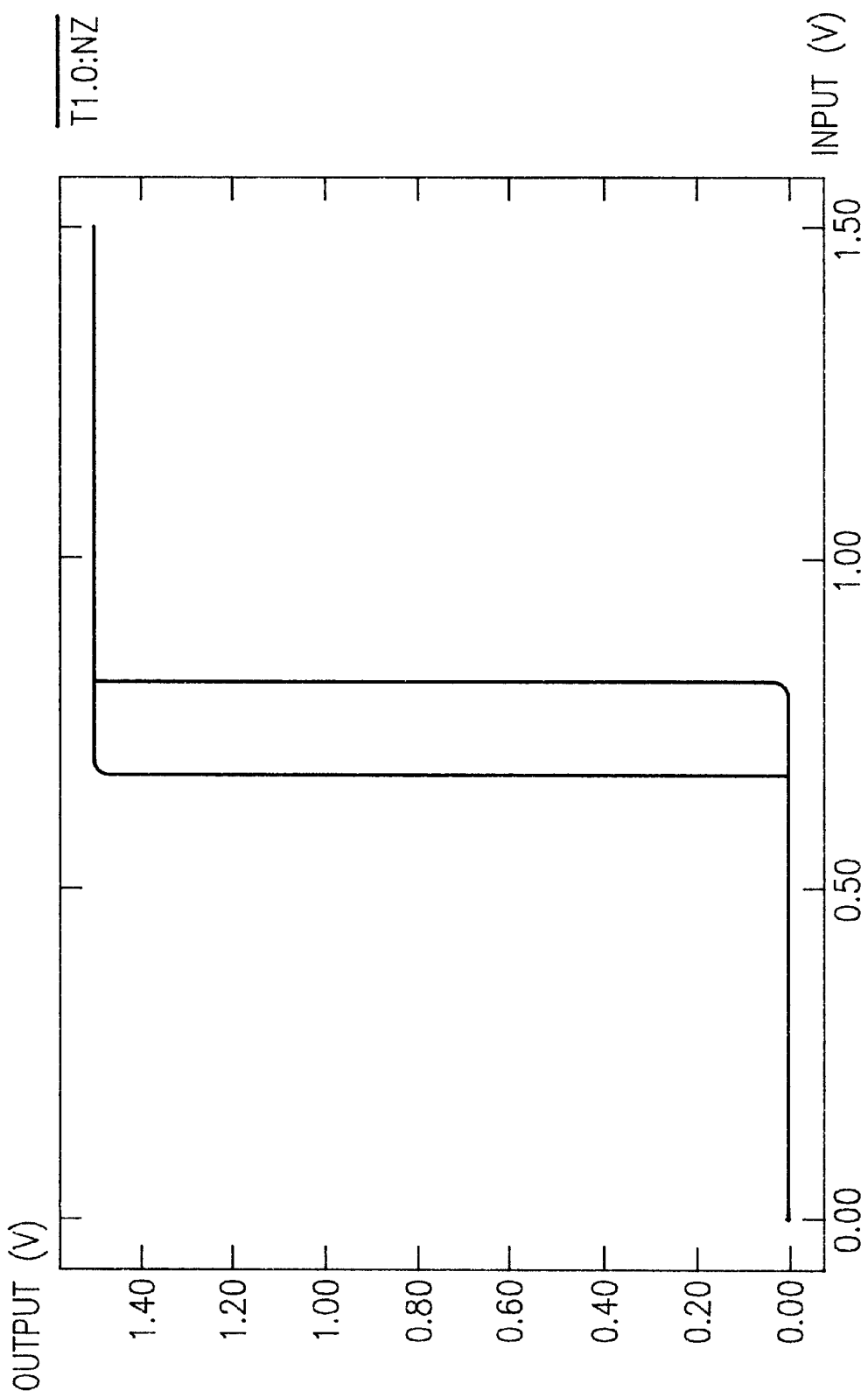
FIG. 7 is a graph with a curves showing the output voltage as a function of input voltages for the CMOS small signal terminated hysteresis receiver constructed according to the present invention.

FIG. 7 has a curve showing the output voltage as a function of input voltages switching at the Vcenter for the CMOS small signal terminated receiver constructed according to the present invention.

In terms of ESD protection, when the circuit described in the present invention is powered up, it has a low resistance path to one of the power supplies depending on the input voltage level, If the input terminal voltage move more then about 0.7 volts outside the upper or lower power supplies, the parasitic diodes and the parasitic bipolar transistor in the pfet 15 and nfet 16 also turn on to further reduce the input impedance, hence improving the performance of the ESD protection. This performance is so effective that an additional ESD protection device may not be necessary to protect this circuit or the input/output circuit connected to this terminal there after. The parasitic elements in pfet 15 and nfet 16 are active even when the devices are not powered which provides significant ESD protection during handing of the device. The implementation shown result in a clean signal on network 20 with no or minimum reflection and noise generated in the system and a fast, solid, clean and reliable small swing can be obtain for a point to point nets as well as a cleaner multiple drop net. This implementation provide the fastest transmission of data and signals with much lower power consumption as compared to split resistive termination networks. The combination of the small signal terminating network and receiver, providing both the termination to the net as well as the center voltage to the differential receiver is a perfect marriage to do small signal operations at high speeds.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A CMOS terminator circuit for connection to a network carrying small logic level signals from a network's first circuit to a network's second circuit in which a network's input terminal connects a terminator circuit to the network's second circuit to act as a terminator on the data line passing data from said first circuit to said second circuit, comprising:

a terminator reference circuit (30) coupled to a terminator input circuit (31) in said terminator and to a differential receiver (24), said terminator input circuit being coupled to said network's input terminal (10) for connecting the network's first circuit to the network's second circuit;

said terminator reference circuit (30) generating two reference voltage levels, a first level voltage for a first node (14) and a second level voltage for a second node of said terminator reference circuit, the first voltage level of said reference voltages being at a level above a tuned reference voltage and the second voltage level of said terminator reference circuit being at a level below said tuned reference voltage, and wherein said first voltage level and said second voltage level on separate paths from said first and second nodes is supplied to said terminator input circuit (31) for the termination to the network as the terminator on the data line passing data from said first circuit to said second circuit supplying, and also, said first voltage level and said second voltage level on the separate paths from said first and second nodes is supplied to said differential receiver which is integrated into the terminator circuit (21) to set up a threshold tuned reference voltage between the logic levels of said terminator input circuit for said network.

2. The CMOS terminator circuit for connection to a network according to claim 1, wherein said tuned reference voltage is tuned to a voltage level equal to the center of an incoming voltage swing between the logic '1' and '0' voltage levels between an upper level power supply and a lower level power supply, and the tuned reference voltage levels are set by said terminator reference circuit and mirrored into said differential receiver.

3. The CMOS terminator circuit for connection to a network according to claim 1, wherein said second node (15) having a voltage level above the tuned reference voltage level is connected to the gate of a terminator input circuit nfet (16) device and said first node (14) having a voltage level below the tuned reference voltage level is connected to the gate of a terminator input circuit pfet (17) whereupon, after arriving at the mirrored devices of the terminator input circuit (31), the voltages on both sides of the tuned reference voltages are combined by the coupled mirrored devices of said terminator input circuit to control value of the signal of the a terminator pad with the sources of a terminator input circuit nfet (16) device and pfet (17) device coupled together and to the network's input terminal, whereby the terminator circuit is connected to the network to connect to a driving circuit (25) to a network driven input circuit.

4. The CMOS terminator circuit for connection to a network according to claim 3 wherein said two reference voltages are supplied by a single reference path which comprises an upper level power supply (11) which is coupled to said second node (15), and from said second node (15) said single reference path is connected to the gate and drain of a reference circuit nfet (52) device, and the source of said reference circuit nfet (52) device is connected to a tuned reference voltage node which is then connected to the source of a reference circuit pfet (53) device, and wherein the gate of the reference circuit pfet (53) device is tied to its drain and both the source and gate of the reference circuit pfet (53) device are connected to the first node (14) which is connected to the lower level power supply (12).

5. The CMOS terminator circuit for connection to a network according to claim 3 wherein said two reference voltages are supplied by a single reference path which comprises a series connected first resistor (51) receiving power from an upper level power supply (11) which is coupled to said said second node (15), and from second node (15) said single reference path is connected to the gate and drain of a reference circuit nfet (52) device, and the source of said reference circuit nfet (52) device is connected to a tuned reference voltage node which is then connected to the source of a reference circuit pfet (53) device, and wherein the gate of the reference circuit pfet (53) device is tied to its drain and both the source and gate of the reference circuit pfet (53) device are connected to the first node (14), and the first node (14) is connected to a second resistor (54) and the other end of said second resistor (54) is connected to the lower level power supply (12).

6. The CMOS terminator circuit for connection to a network according to claim 3 wherein said terminator reference circuit has a reference circuit nfet and reference circuit pfet connect back to back gate to drain to track corresponding mirror devices of said terminator input devices to control each of their turn on voltages, so that no excessive through current in reference circuit nfet (16) and pfet (17) will occur, and wherein, at this logic state, one of the mirror devices will be off and reduce the power requirements of the terminator circuit.

7. The CMOS terminator circuit for connection to a network according to claim 5 wherein the resistors are adjusted to adjust the swing voltage of the terminator.

8. The CMOS terminator circuit for connection to a network according to claim 5 wherein the resistors are adjusted to adjust the swing voltage of the terminator to that approximating an ideal 50 ohm split resistor terminator.

9. The CMOS terminator circuit according to claim 8 wherein parasitic diodes and a parasitic bipolar transistor in the terminator input circuit pfet (17) and nfet (16) mirror devices are active even when the mirror devices are not powered to provide ESD (electrostatic discharge) protection during handling of the device.

10. The CMOS terminator circuit according to claim 3 wherein said differential receiver provides a hysteresis receiver which is integrated into the terminator circuit (21), which the hysteresis receiver has a receiver input device nfet (516) which is mirrored to said terminator input circuit nfet (16) device with its gate connected to said second node (15), said receiver nfet device's source being connected to said network's input terminal (10) and drain to a first receiver node (521) and to drain of a first receiver load device (resistor or pfet 502) and wherein the source of said first receiver load device (resistor or pfet 502) connects to said upper level power supply reference voltage (node 11 or VDD), when said first receiver load device (resistor or pfet 502) is biased "on" with its gate connected to said lower level power supply (node 12).

11. The CMOS terminator circuit according to claim 10 wherein said differential receiver has a mirrored receiver input device (pfet 517) which is mirrored to said terminator input circuit pfet (17), with the gate of said mirrored receiver input device pfet (517) connected to said second node 14 and the source of said receiver input device pfet is connected to said network's input terminal (10) and its drain connected to a second receiver node (520) and to the drain of a second receiver load device (nfet 501), when said second receiver load device (nfet 501) is biased "on" with its gate connected to said upper level power supply (node 11) and a source of said second receiver load device (nfet 501) is connected to said lower level power supply (node 12).

12. The CMOS terminator circuit according to claim 11 differential wherein said receiver has said second receiver node (520) and first receiver node (521) coupled to an inverting latch circuit which latches a signal and makes the hysteresis path of the differential receiver, with the inverting latch circuit output then connected to an output terminal (Z) of the hysteresis receiver (24).

13. The CMOS terminator circuit according to claim 12 wherein when a logical "1" is driven to said network's input terminal (10) said mirrored receiver input device (pfet 517) will turn on the same way as said terminator circuit mirrored pfet (21) turns on to then pull up said second receiver node (520) above the turn on voltage and overcome the inverting latch circuit and pull down the first receiver node to set the differential receiver output to "1" after the inverted output.

14. The CMOS terminator circuit according to claim 13 wherein when a logical "0" is driven to said network's input terminal (10) said hysteris latch will be pulled up to a logical "1" level and this then sets the receiver output (Z) to "0" after the inverting latch output.

* * * * *

UNITED STATES PATENT AND TRADEMARK OFFICE
CERTIFICATE OF CORRECTION

PATENT NO. : 6,281,702 B1
DATED : August 28, 2001
INVENTOR(S) : Hui

It is certified that error appears in the above-identified patent and that said Letters Patent is hereby corrected as shown below:

Column 8,
Line 65, "differential wherein said" should be -- wherein said differential --.

Signed and Sealed this

Fourth Day of June, 2002

*Attest:*

*Attesting Officer*

JAMES E. ROGAN
*Director of the United States Patent and Trademark Office*